United States Patent [19]

Stephenson

[11] 4,036,763
[45] July 19, 1977

[54] NOISE AND DRIFT CORRECTING AMPLIFIER CIRCUIT FOR A LIVE-SCAN IMAGING SYSTEM

[75] Inventor: Peter Robert Norman Stephenson, Stevenage, England

[73] Assignee: Hawker Siddeley Dynamics Limited, England

[21] Appl. No.: 603,736

[22] Filed: Aug. 11, 1975

[30] Foreign Application Priority Data

Aug. 14, 1974 United Kingdom ............... 35759/74

[51] Int. Cl.² ............................................. H01J 39/12
[52] U.S. Cl. ................................. 250/214 C; 250/559
[58] Field of Search ............... 250/214 R, 214 C, 206, 250/572, 575, 568, 599; 178/7.6

[56] References Cited

U.S. PATENT DOCUMENTS

| | | | |
|---|---|---|---|
| 3,744,913 | 7/1973 | Farthing et al. | 250/214 R |
| 3,789,215 | 1/1974 | Penny | 250/214 C |
| 3,820,068 | 6/1974 | McMillin | 250/568 |
| 3,863,066 | 1/1975 | Liedholz | 250/214 R |
| 3,927,317 | 12/1975 | Liedholz | 250/214 R |

*Primary Examiner*—David C. Nelms
*Attorney, Agent, or Firm*—Rose & Edell

[57] ABSTRACT

In an imaging system, a radiation detector which scans an image has it output amplified by a D.C. preamplifier and to neutralize low frequency noise and drift the preamplifier output is amplified by a further D.C. amplifier having a feedback capacitor and to which a reference voltage is applied the further amplifier output being applied as a second input to the preamplifier. A sample and hold switch controls the application of the preamplifier output to the further amplifier, this switch being closed only during the dead times between consecutive scan lines.

3 Claims, 1 Drawing Figure

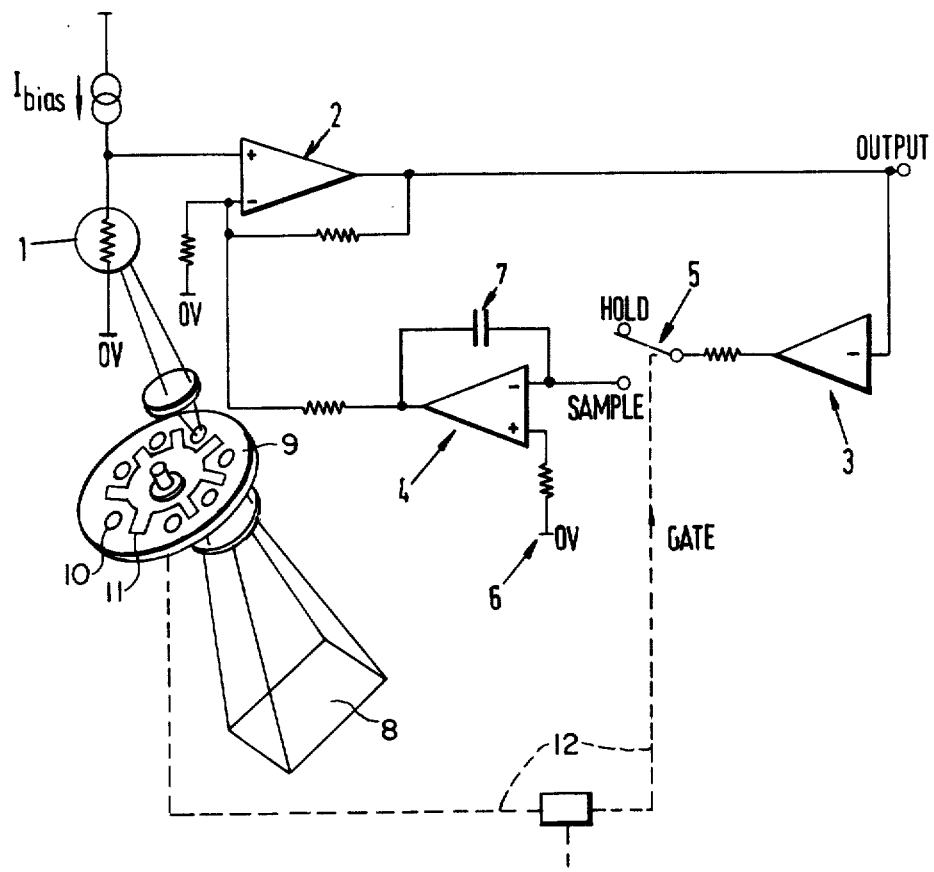

NOISE AND DRIFT CORRECTING AMPLIFIER CIRCUIT FOR A LIVE-SCAN IMAGING SYSTEM

This invention relates to the amplification of electrical signals in imaging systems. More particularly, it is concerned with the provision of means for extending the low frequency response of radiation detector preamplifiers without use of large capacitors.

In some applications of radiation detectors, such as for the generation of images as in television, it is necessary to use wide band video amplifiers to amplify the signals. In some forms of imaging system the television raster is built up by traversing detectors across an image of the scene. Where it is difficult to obtain adequate sensitivity, this may be increased by increasing the number of detectors used and so reducing the bandwidth and consequently the noise associated with each detector. When this is done, however, it is necessary to shift the whole frequency response to lower frequencies and this tends to require the use of large capacitors in the filters defining the low frequency response of the system. On the other hand, because the number of amplifiers is increased it is often undesirable to use large capacitors because they make the bulk of the total electronics unacceptable.

In some applications it may be possible to use D.C. amplifiers to avoid the need for capacitor couplings, but often this is not possible because drifts and low frequency noise effects then become unacceptable.

According to the present invention, there is provided an imaging system comprising a radiation detector which is repeatedly scanned across an image to build up a raster, a D.C. preamplifier amplifying the detector signal applied thereto on one input, a further D.C. amplifier receiving on one input the preamplifier output via a sample and hold switch, said further D.C. amplifier having a feedback capacitor and a reference voltage applied to a second input, and the output of said further amplifier being applied to a second input of the preamplifier, the sample and hold switch being open during scanning of a line of the raster and closed during the dead time between consecutive scan lines.

Thus, the invention permits the use of D.C. amplifiers, low frequency noise and drift being corrected before each raster scan line by adjustment of a bias which is then maintained by a sample and hold circuit throughout that line. In the dead time before the next active scan line, the bias is readjusted to account for any drift which has taken place during the previous line.

One arrangement in accordance with the invention will now be described by way of example with reference to the accompanying drawing, which is a diagram of a radiation detector circuit.

Referring to the drawing, a radiation detector is shown as a photoconductive detector with constant current bias. Variation in the level of radiation falling on this detector as it scans the image of the scene 8 varies its conductivity and so the voltage developed across it, the scanning being effected by a conventional rotary scanner 9 with a series of scanning apertures 10 disposed equidistantly in a ring. The method is applicable, however, to any form of detector producing an electrical output which requires to be amplified.

A D.C. preamplifier 2 amplifies the signal from the detector 1. Before each active scan line a reference source of radiation is imaged on to the detector and a sample/hold switch 5 is closed, the reference radiation source being provided by blanking the optical system of the scanner 9 by means of vanes 11 interposed between consecutive ones of the scanning apertures 10. The scanner 9 and sample/hold switch 5 are operated by synchronized drives 12 to ensure closing of the switch at the correct times. A D.C. amplifier 4 is then fed with the preamplifier output, phase inverted by a phase inverter 3. This charges the feedback capacitor 7 of the amplifier 4, until the output of the preamplifier is driven to equal a reference voltage 6, shown in the drawing as 0 volts. Before the beginning of the next active scan line switch 5 is opened and the preamplifier mean output level is maintained at the reference voltage 6 throughout the next scan line by the charge stored on the feedback capacitor 7. The component values can be chosen such that this capacitor is small, typically 0.01 microfarads.

What I claim is:

1. Line-scan imaging apparatus including electrical circuitry automatically correcting for noise and drift, comprising a radiation detector which is repeatedly scanned across an image to build up a raster consisting of a succession of active scan lines with dead times between, a D.C. preamplifier having first and second inputs and receiving and amplifying the detector signal applied thereto on said first input, a further D.C. amplifier having first and second inputs and a feedback capacitor connected between its output and its first input, means applying a reference voltage to the second input of said further D.C. amplifier, means applying the output of said further D.C. amplifier to the second input of said preamplifier, means applying the output of the preamplifier to the first input of said further D.C. amplifier which means include a sample and hold switch that when closed applies the output from the preamplifier to said first input of said further D.C. amplifier but can be opened to remove the preamplifier output from said further amplifier, and means for automatically opening said switch during each line scan and closing said switch during each dead time.

2. A system according to claim 1, further comprising means for imaging said reference source of radiation on to the detector during the periods when said switch is closed.

3. A system according to claim 1, comprising a phase inverter interposed between the preamplifier and said sample and hold switch.

* * * * *